United States Patent
Yokota et al.

(10) Patent No.: US 8,334,078 B2
(45) Date of Patent: Dec. 18, 2012

(54) FUEL CELL SEPARATOR AND METHOD FOR PRODUCING THE SAME

(75) Inventors: Masayuki Yokota, Izumi (JP); Fumiaki Kikui, Izumi (JP); Ken Asada, Izumi (JP)

(73) Assignee: Neomax Materials Co., Ltd., Suita-shi, Osaka (JP)

(*) Notice: Subject to any disclaimer, the term of this patent is extended or adjusted under 35 U.S.C. 154(b) by 263 days.

(21) Appl. No.: 12/514,975

(22) PCT Filed: Nov. 16, 2007

(86) PCT No.: PCT/JP2007/072259
§ 371 (c)(1),
(2), (4) Date: May 14, 2009

(87) PCT Pub. No.: WO2008/059950
PCT Pub. Date: May 22, 2008

(65) Prior Publication Data
US 2010/0055539 A1    Mar. 4, 2010

(30) Foreign Application Priority Data
Nov. 16, 2006 (JP) .................. 2006-310353

(51) Int. Cl.
*H01M 4/02* (2006.01)
(52) U.S. Cl. ......... 429/468; 429/469; 429/400; 429/508
(58) Field of Classification Search .............. 429/129, 429/508, 468, 469
See application file for complete search history.

(56) References Cited

U.S. PATENT DOCUMENTS

| | | | |
|---|---|---|---|
| 4,469,579 A * | 9/1984 | Covitch et al. | 204/283 |
| 6,967,065 B1 * | 11/2005 | Saitou et al. | 429/509 |
| 2003/0235711 A1 | 12/2003 | Seido et al. | |
| 2004/0081879 A1 | 4/2004 | Washima et al. | |
| 2006/0154131 A1 | 7/2006 | Seido et al. | |
| 2008/0138691 A1 | 6/2008 | Kikui | |

FOREIGN PATENT DOCUMENTS

| | | |
|---|---|---|
| JP | 2000-323148 | 11/2000 |
| JP | 2001-093538 | 4/2001 |
| JP | 2001-297777 | 10/2001 |
| JP | 2005-347282 | 12/2005 |
| WO | WO2006062349 | * 6/2006 |

OTHER PUBLICATIONS

International Search Report for PCT/JP2007/072259 Dated Feb. 19, 2008.
International Preliminary Report on Patentability and Written Opinion of the International Search Authority (Application No. PCT/JP2007/072259) with English Translation; mailed on Jun. 4, 2009.
Canadian Office Action issued in Canadian Patent Application No. 2,669,526 mailed Mar. 1, 2012.

* cited by examiner

*Primary Examiner* — Jane Rhee
(74) *Attorney, Agent, or Firm* — Nixon Peabody LLP; Jeffrey L. Costellia

(57) ABSTRACT

A separator for a fuel cell according to the present invention includes: a base 1 containing 70 mass % or more of Al; an underlying layer 2 being formed on the base and containing Ti; an intermediate layer 3 being formed on the underlying layer and containing $TiN_x$ or $TiO_y$; and a conductive metal layer 4 being formed on the intermediate layer and containing Au or Pt. The separator for a fuel cell according to the present invention has an excellent anticorrosiveness although a base containing aluminum as a main component is used.

11 Claims, 2 Drawing Sheets

(a)

(b)

(a)

(b)

(a)

(b)

CORRODED PORTIONS (a)

16a  15a  12  14a  11  14b  13  15b  16b (b)

ANODE
$H_2 \rightarrow 2H^+ + 2e^-$

CATHODE
$2H^+ + 1/2O_2 + 2e^- \rightarrow H_2O$

FUEL CELL SEPARATOR AND METHOD FOR PRODUCING THE SAME

TECHNICAL FIELD

The present invention relates to a separator for a fuel cell (current collector), and in particular to a separator which is suitable for a polymer electrolyte fuel cell to be used in power sources for automobiles, power sources for mobile devices, distributed generation sources, and the like.

BACKGROUND ART

Vigorous research activities are being directed to fuel cells as a next-generation energy source, due to their high generation efficiency and low burden on the environment.

A fuel cell is a power generation device in which hydrogen as a fuel and oxygen are allowed to undergo an electrochemical reaction, from which electric energy is elicited. Depending on the type of electrolyte used, fuel cells are classified into: the Solid Oxide Fuel Cell (SOFC); the Molten Carbonate Fuel Cell (MCFC); the Phosphoric Acid Fuel Cell (PAFC); and the Polymer Electrolyte Fuel Cell (PEFC, including DMFCs in which methanol is used). Among others, PEFCs and DMFCs have operating temperatures as low as about 70 to 90° C. (as compared with other types of fuel cells), and enable a higher-efficiency power generation by about 1 kW in the case of PEFCs, and about several hundred W in the case of DMFCs. Therefore, PEFCs and DMFCs are considered promising for applications such as automobiles, mobile devices, and the like. In particular, DMFCs are small in size, and thus their applications to mobile devices are being vigorously studied.

Hereinafter, with reference to FIG. 4, the structure and principle of a polymer electrolyte fuel cell (PEFC) will be described.

FIG. 4(a) is a perspective view schematically showing the structure of a cell (battery) portion 20, which is a minimum structural unit of a polymer electrolyte fuel cell (PEFC). FIG. 4(b) is a schematic diagram showing the principle behind a PEFC.

As shown in FIG. 4(a), a cell 20 in a fuel cell includes an ion exchange membrane (solid polymer membrane) 11 in the middle, with two electrodes being disposed on its sides: a fuel electrode (hydrogen electrode, anode side) 12 and an air electrode (or oxygen electrode, cathode side) 13. The ion exchange membrane 11 is a membrane for allowing protons ($H^+$) to move from the fuel electrode 12 to the air electrode 13. It is often the case that the ion exchange membrane 11 has electrode catalyst layers 14a and 14b on both sides thereof, and thus the ion exchange membrane 11 and the electrode catalyst layers 14a and 14b are collectively referred to as a membrane electrode assembly (MEA). On the outside of the fuel electrode 12 and the air electrode 13, separators 16a and 16b are provided via gaskets 15a and 15b, respectively. Thus, hydrogen (anode side) moves between the MEA and the separator 16a, and oxygen (cathode side) moves between the MEA 20 and the separator 16b (see FIG. 4(b)). On the surface of the separators 16a and 16b, trenches are formed through which reaction gases of hydrogen and oxygen pass.

As shown in FIG. 4(b), at the anode side, hydrogen ($H_2$) is supplied through the trench in the surface of the separator 16a, and uniformly diffused into the electrode catalyst layer 14a by the action of the fuel electrode 12. On the electrode catalyst layer 14a, $H_2$ becomes $H^+$ through a reaction of formula (1) below, and passes through the ion exchange membrane 11 and moves to the electrode catalyst layer 14b on the cathode side. On the other hand, at the cathode side, oxygen ($O_2$) is supplied through the trench in the surface of the separator 16b, and uniformly diffused into the electrode catalyst layer 14b by the action of the air electrode 13. On the electrode catalyst layer 14b, a reaction of formula (2) below occurs between the $O_2$ having been diffused in this manner and the $H^+$ which has moved through the ion exchange membrane 11 from the anode side, whereby $H_2O$ is generated.

$$H_2 \rightarrow 2H^+ + 2e^- \qquad \text{formula (1)}$$

$$2H^+ + 1/2 O_2 + 2e^- \rightarrow H_2O \qquad \text{formula (2)}$$

At this time, power generation occurs due to the electrons ($e^-$) which are generated at the anode side. Therefore, the separator is required to efficiently supply reaction gases of oxygen and hydrogen to the electrode catalyst layer 14a.

Depending on the amount of electric power, a plurality of cells (unit cells) having the above construction may be layered so as to be used in the form of a stack. In this case, the separators will act as partitions between unit cells, and therefore are required to ensure that the gas (hydrogen) from the fuel electrode and the gas (oxygen) from the air electrode will not become mixed in between cells.

From such standpoints, a separator is required to have little gas permeability, a good electrical conductivity, a low contact resistance, a good anticorrosiveness, and so on. In particular, there emerge stronger and stronger anticorrosiveness and electrical conductivity requirements in the recent years. As an evaluation criterion of anticorrosiveness, it is proposed that "no rust should occur even if the separator is immersed in a sulfuric acid solution whose pH is about 1", and so on.

As a separator material having such characteristics, carbon materials have been used in general. However, carbon materials have poor toughness and are brittle, and therefore are difficult to process, thus resulting in a problem of high processing costs.

Therefore, in the recent years, metal materials, especially stainless steel materials, have been considered as separator materials instead of carbon materials, because metal materials are easy to process and incur low processing costs.

For example, there have been proposed separators in which a plating of a metal film, e.g., platinum or gold, is provided on a stainless steel. Since an oxide coating (passivation film) in which Cr has bonded to oxygen occurs on the surface of the stainless steel, the anticorrosiveness is excellent but the contact resistance is large, so that this cannot be used for a separator material as it is. Therefore, it might be conceivable to coat the surface of the stainless steel with a precious metal such as platinum or gold, which have excellent anticorrosiveness and electrical conductivity. However, the adhesion between a passivation film and a metal film is very poor, thus making it difficult to directly form a film of a precious metal on the surface of stainless steel.

Therefore, a method has been employed which involves completely removing the passivation film via etching or the like, and thereafter optionally forming an underlying plating layer containing a metal such as Ni, and then providing a plating of precious metal. Furthermore, in Patent Document 1, for example, a method of forming an underlying metal layer of a Ta, Zr, or Ti layer for obtaining a high anticorrosiveness is proposed. Moreover, the Applicants of the present application have disclosed in Patent Document 2 that a further improvement in anticorrosiveness is possible by forming an intermediate layer containing oxygen, metal atoms that compose the metal layer, and Fe and Cr which are contained in the steel, between a metal layer of Ta or the like and a steel.

[Patent Document 1] Japanese Laid-Open Patent Publication No. 2001-93538

[Patent Document 2] International Publication No. WO 2006/082734A1

DISCLOSURE OF INVENTION

Problems to be Solved by the Invention

Recently, there is an increasing need for reduction in the weight of a fuel cell, and use aluminum of instead of a stainless steel is being desired. However, aluminum is an amphoteric metal and therefore is more susceptible to corrosion than are stainless steels. Thus, it is even more difficult to obtain an anticorrosiveness that satisfies the aforementioned evaluation standards.

The present invention has been made in view of the above points, and an objective thereof is to provide a separator for a fuel cell having an excellent anticorrosiveness by using a base which contains aluminum as a main component, and a method of producing such a separator.

Means for Solving the Problems

A separator for a fuel cell according to the present invention characterized by comprising: a base containing 70 mass % or more of Al; an underlying layer being formed on the base and containing Ti; an intermediate layer being formed on the underlying layer and containing TiNx or TiOy; and a conductive metal layer being formed on the intermediate layer and containing Au or Pt.

In one embodiment, the underlying layer has a thickness of 0.2 μm or more. Preferably, the underlying layer has a thickness of 10 μm or less.

In one embodiment, the intermediate layer has a thickness between 0.1 μm and 2.0 μm.

In one embodiment, x in TiNx is preferably 1.0 or less and y in TiOy is preferably 2.0 or less.

In one embodiment, the conductive metal layer has a thickness of 0.05 μm or more.

In one embodiment, the conductive metal layer has a thickness of 0.10 μm or less, and a total thickness of the underlying layer and the intermediate layer is 0.5 μm or more.

In one embodiment, the conductive metal layer has a thickness of 0.10 μm or less, and the intermediate layer has a thickness of 0.3 μm or more.

A method of producing a separator for a fuel cell according to the present invention is characterized by comprising the steps of: (a) providing a base containing 70 wt % or more of Al; (b) cleaning a surface of the base; (c) forming an underlying layer containing Ti on the cleaned surface of the base by a vapor deposition technique; (d) forming an intermediate layer containing TiNx or TiOy on the underlying layer by a vapor deposition technique; and (e) forming a conductive metal layer containing Au or Pt on the intermediate layer.

In one embodiment, the vapor deposition techniques in steps (c) and (d) are a sputtering technique or an ion plating technique.

In one embodiment, after step (b) and before step (c), a step of at least partially removing an oxide film that is on the surface of the base is further comprised.

In one embodiment, step (a) is a step of providing a base made of a die-cast aluminum alloy; before step (c), a step of performing a vacuum heating at a temperature between 300° C. and 350° C. is further comprised; and steps (c) and (d) are performed at a temperature which is equal to or less than that of the vacuum heating.

EFFECTS OF THE INVENTION

A separator for a fuel cell according to the present invention includes on an aluminum base a Ti layer which has excellent adhesion with aluminum and aluminum oxide, and further thereupon a nitride layer or oxide layer of Ti which has excellent reactivity and adhesion with Ti, and an Au or Pt layer on the outermost surface. Thus, a separator for a fuel cell according to the present invention has excellent anticorrosiveness.

DESCRIPTION OF REFERENCE NUMERALS

| | |
|---|---|
| 1 | Al-containing base |
| 1a | Al-containing alloy |
| 1b | Al oxide layer |
| 2 | Ti layer |
| 3 | TiNx or TiOy |
| 4 | Au or Pt |
| 11 | ion exchange membrane (solid polymer membrane) |
| 12 | fuel electrode (hydrogen electrode) |
| 13 | air electrode (oxygen electrode) |
| 14a, 14b | electrode catalyst layer |
| 15a, 15b | gasket |
| 16a, 16b | separator |
| 20 | cell of fuel cell |

BEST MODE FOR CARRYING OUT THE INVENTION

Hereinafter, with reference to the drawings, the structure of a separator for a fuel cell according to an embodiment of the present invention will be described. As will be later described by showing some of the Examples, the inventors have prototyped separators of various film constructions and evaluated their anticorrosiveness, thus arriving at the present invention. Hereinafter, the structure of the separator for a fuel cell according to an embodiment of the present invention and the functions and effects thereof will be described, but such descriptions do not limit the present invention.

Figure 1:
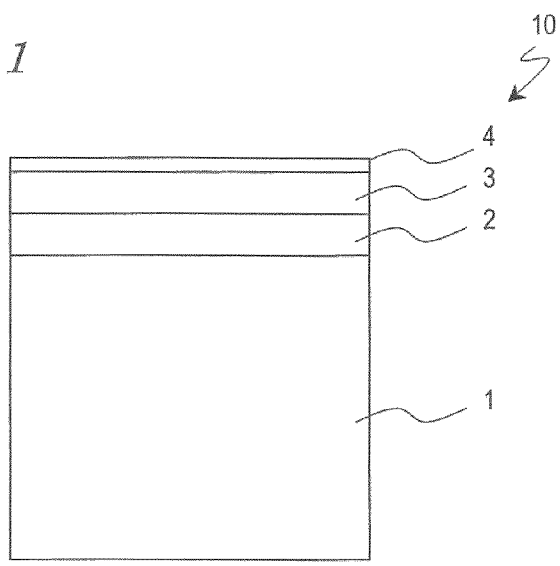
FIGS. 1 (a) and (b) are cross-sectional views schematically showing the structure of a separator for a fuel cell according to an embodiment of the present invention.
Figure 1:
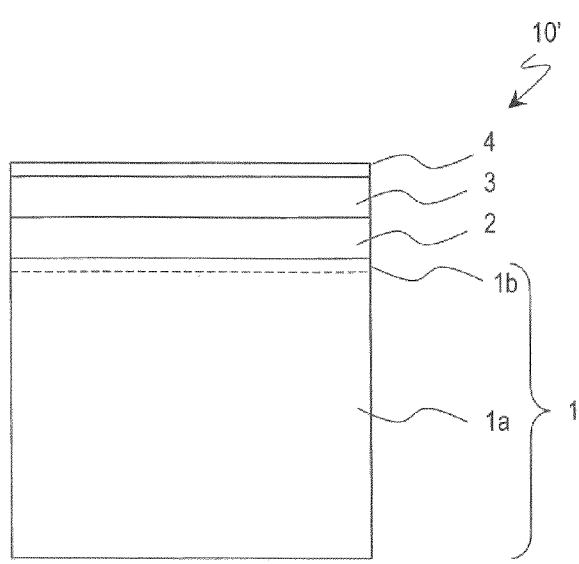

FIGS. 1(a) and (b) are cross-sectional views schematically showing the structure of the separator for a fuel cell according to an embodiment of the present invention.

The separator 10 for a fuel cell shown in FIG. 1(a) includes: a base 1 containing 70 mass % or more of Al; an underlying layer 2 being formed on the base 1 and containing Ti; an intermediate layer 3 being formed on the underlying layer and containing TiNx or TiOy; and a conductive metal layer 4 being formed on the intermediate layer 3 and containing Au or Pt.

The base 1 is a substrate which is made of an aluminum alloy containing 70 mass % or more of Al (pure aluminum also being included), for example. The aluminum alloy includes so-called die-cast aluminums (alloys which are cast in a die). Since an alloy containing 70 mass % of aluminum has a smaller specific gravity than that of a stainless steel, it contributes to weight reduction of a fuel cell. In particular, it is suitably used for applications where a multitude of cells are combined (for example, nearly a hundred cells are stacked in a fuel cell of a handicapped-accessible automobiles). In particular, die-cast aluminums are preferable because they can be made into a desired shape with an excellent mass producibility. Note that, if the Al content is less than 70 mass %, the properties of Al will not be exhibited and the functions and effects described later may not be obtained.

The underlying layer 2 containing Ti is typically a Ti layer, and is formed on a clean surface of the base 1 by a vapor deposition technique. Ti excels in adhesion with Al, and also in adhesion with Al oxide (typically $Al_2O_3$). Therefore, a good adhesion is attained not only in a structure where a Ti layer is directly form detect on a base 1 which is made of an aluminum alloy containing 70 mass % or more of Al as shown in FIG. 1(a), but also where an Al oxide layer 1b exists on the surface of a main body 1a which is made of an aluminum alloy containing 70 mass % or more of Al, as shown in FIG. 1(b). Although a relatively thick Al oxide layer is formed on the surface of die-cast aluminum, a good adhesion can be obtained without completely removing it, whereby a high production efficiency can be obtained. However, it is not preferable for the Al oxide layer to have a thickness of 10 μm or more because the adhesion with the Ti layer 2 will be lowered.

The thickness of the Ti layer 2 is preferably 0.2 μm or more. If the thickness of the Ti layer 2 is less than 0.2 μm, a sufficient anticorrosiveness cannot be obtained. Note that there is no particular upper limit to the thickness of the Ti layer 2. For economic reasons, it is preferably 10 μm or less. Even if the thickness exceeds 10 μm, stress and cracking will not occur, and according to an experiment by the inventors, these problems do no occur up to a thickness of at least about 20 μm.

The intermediate layer 3 which is formed on the underlying layer 2 including a Ti layer contains TiNx or TiOy. TiNx and TiOy are preferable because they have a high reactivity with Ti, have a high adhesion with Au and Pt, and create a dense film. It is preferable that the thickness of the intermediate layer 2 is between 0.1 μm and 2.0 μm. If the thickness is thinner than 0.1 μm, a sufficient anticorrosiveness may not be obtained. If the thickness exceeds 2.0 μm, cracking due to stress may occur.

It is preferable that x in TiNx is 1.0 or less. From the standpoint of anticorrosiveness, x is preferably 0.5 or more, and more preferably between 0.7 and 1.0. On the other hand, it is preferable that y in TiOy is 2.0 or less. From the standpoint of anticorrosiveness, it is preferably 1.0 or more, and more preferably between 1.2 and 2.0. However, in the case where the intermediate layer 3 is made of TiOy, it is preferable that TiOH is not contained and that formation is carried out in a vacuum free of moisture.

The conductive metal layer 4 containing Au or Pt is typically an Au layer or a Pt layer. The conductive metal layer 4 containing Au or Pt has a high electrical conductivity, and excels in adhesion with the intermediate layer 3 containing TiNx or TiOy. In order to obtain a sufficient electrical conductivity, it is preferable that the thickness of the conductive metal layer is 0.05 μm or more. From the standpoint of anticorrosiveness, when the thickness of the conductive metal layer is 0.10 μm or less, the total thickness of the underlying layer 2 and the intermediate layer 3 is preferably 0.5 μm or more, in which case the thickness of the intermediate layer 3 is preferably 0.3 μm or more.

The separator 10 for a fuel cell shown in FIG. 1(a) or a separator 10' for a fuel cell shown in FIG. 1(b) can be produced in the following manner, for example.

First, a base 1 containing 70 wt % or more of Al is provided. A commercially available Al alloy, e.g., high-purity Al under JIS 1000's, Al under JIS5000's, and also a die-cast aluminum can be used.

Next, the surface of the base 1 is cleaned. For example, degreasing and acid cleaning using an organic solvent is performed, thus exposing a clean surface of the base 1. At this time, as necessary, the oxide film is removed. Although the oxide film does not need to be completely removed, a sufficient adhesion with the underlying layer (Ti layer) 2 may not be obtained when the thickness of the Al oxide film exceeds 10 μm, for example. Therefore, before forming the underlying layer 2, as necessary, the oxide film on the surface of the base 1 is removed at least partially. Removal of the oxide film is performed by anion sputtering in an Ar gas ambient (reduced pressure), for example.

Thereafter, on the cleaned surface of the base 1, an underlying layer 2 containing Ti is formed by a vapor deposition technique. As the vapor deposition technique, a sputtering technique or an ion plating technique is preferable from the standpoint of productivity.

Next, on the underlying layer 2, an intermediate layer 3 containing TiNx or TiOy is formed by a vapor deposition technique. Similarly to the underlying layer 3, a sputtering technique or an ion plating technique is preferably used. Moreover, the formation of the underlying layer 2 and the intermediate layer 3 is preferably carried out within the same vacuum chamber.

Finally, a conductive metal layer 4 containing Au or Pt and being formed on the intermediate layer 3 is formed. The conductive metal layer 4 is also to be formed by a sputtering technique or an ion plating technique. The series of processes from the step of removing the oxide layer to the final step of forming the conductive metal layer 4 are preferably carried out within the same vacuum chamber.

Note that, in the case where a base which is composed of a die-cast aluminum alloy is used as the base 1, impurities contained in the die-cast aluminum alloy, e.g., moisture, are preferably removed before the step of forming the underlying layer 2. This step is carried out by performing a vacuum heating at a temperature between 300° C. and 350° C., for example. In this case, the steps following the step of forming the underlying layer 2 are preferably performed at a temperature equal to or less than that of the vacuum heating.

Next, by way of Examples and Comparative Examples, the method of producing, structure, and anticorrosiveness of a separator for a fuel cell according to an embodiment of the present invention will be described.

The anticorrosiveness test was performed under the following conditions.

Figure 2:
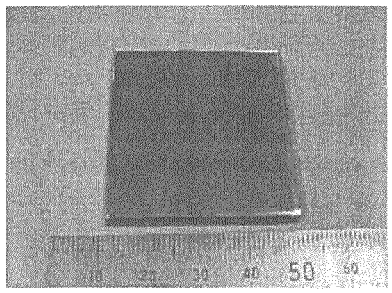
FIGS. 2 (a) and (b) are photographs showing the exterior appearance of a sample of Example 1, where: (a) shows a state before an anticorrosiveness test; and (b) shows a state after the anticorrosiveness test (×30).
Figure 2:
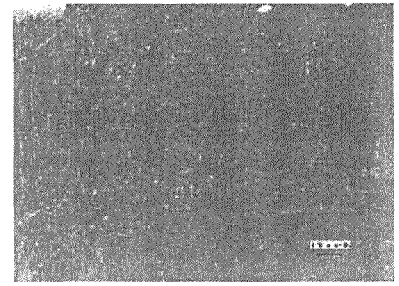
Figure 3:
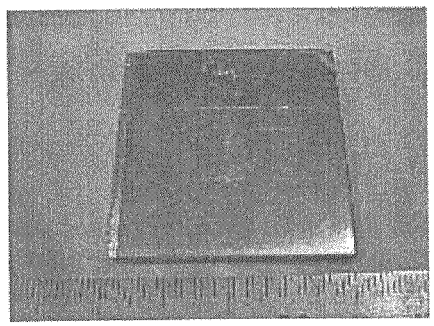
FIGS. 3 (a) and (b) are photographs showing the exterior appearance of a sample of Comparative Example 1, where: (a) shows a state before an anticorrosiveness test; and (b) shows a state after the anticorrosiveness test (X 30).
Figure 3:
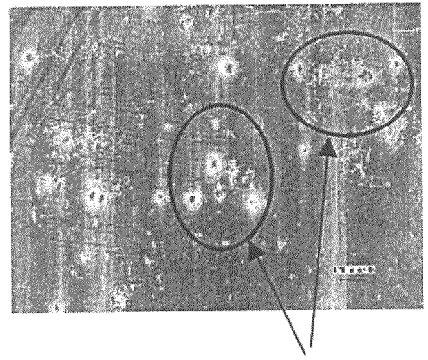
Figure 4:
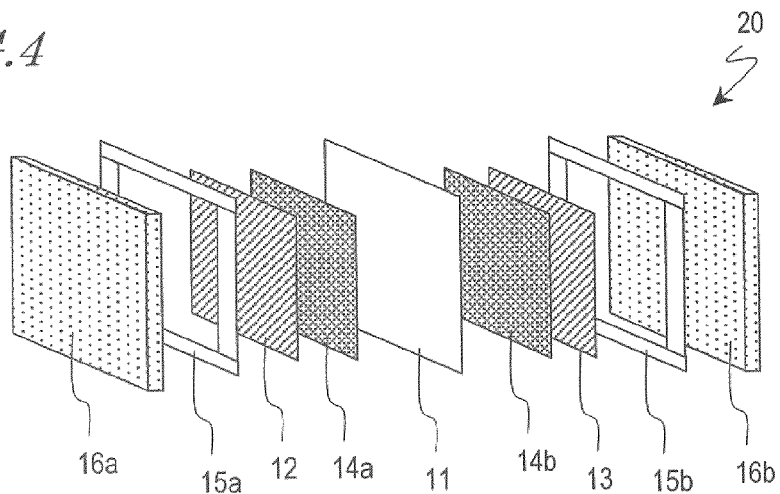
FIG. 4 (a) is a perspective view schematically showing the structure of a cell (battery portion) 20, which is a minimum structural unit of a polymer electrolyte fuel cell (PEFC); and (b) is a schematic diagram showing the principle behind a PEFC.
Figure 4:
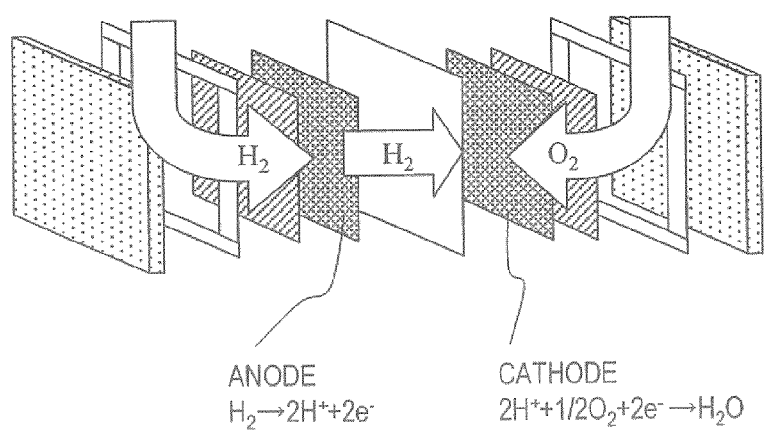

Each sample (Al base with Au-coating, pretending to be a separator for a fuel cell) was immersed in a sulfuric acid solution (35° C.) of pH1. Occurrences of rust in 1000 hours and 1500 hours after the immersion were observed with a stereomicroscope (magnification: X30). It is defined that an "excellent anticorrosiveness" exists when absolutely no rust occurs after 1000 hours' immersion in a sulfuric acid solution of pH1. The results of evaluation are shown in Table 1. Moreover, photographs showing the exterior appearance of the sample of Example 1 described below are shown in FIG. 2, whereas photographs showing the exterior appearance of the sample of Comparative Example 1 are shown in FIG. 3. In each figure, (a) shows a state before the anticorrosiveness test, whereas (b) shows a state after the anticorrosiveness test (×30). As is clear from the results of Table 1 and FIG. 2 and FIG. 3, separators for a fuel cell according to the Examples of the present invention have a high anticorrosiveness. As for electrical conductivity, it was confirmed through evaluations using a surface resistance meter (196 System DMM manufactured by KEITHLEY, Inc.) that the samples of Examples 1 to 14 all have sufficient electrical conductivity.

Example 1

As the Al base, an Al base (40 mm×50 mm×2 mm) of JIS1100 substance (purity: 99% or higher) was provided.

Degreasing and acid cleaning for the surface of the Al base were performed, and after drying, the Al base was set in a vacuum chamber.

First, in an Ar gas ambient at 2 to $5\times10^{-1}$ Pa, a cathode sputtering was performed for 10 minutes, thereby removing the oxide film on the surface.

Next, by using Ti as a target, a Ti layer with a thickness of 0.5 μm was formed by an arc ion plating technique, under the following conditions: an Ar gas pressure of $2\times10^{-1}$ Pa; a bias voltage of −80 V; and a substrate temperature of 280° C.

Next, a TiNx layer with a thickness of 0.1 μm was formed by an arc ion plating technique under the following conditions: $N_2$ gas $15\times10^{-1}$ Pa; a bias voltage of −100 V; and a substrate temperature of 280° C.

Thereafter, the target within the vacuum chamber was replaced with Au, and an Au layer with a thickness of 0.1 μm was formed at: an Ar gas pressure of $3\times10^{-1}$ Pa; a bias voltage of −80 V; and a substrate temperature of 200° C.

Example 2

As the Al base, an Al base (40 mm×50 mm×2 mm) of JIS1100 substance (purity: 99% or higher) was provided.

Degreasing and acid cleaning for the surface of the Al base were performed, and after drying, the Al base was set in a vacuum chamber.

First, in an Ar gas ambient at 2 to $5\times10^{-1}$ Pa, a cathode sputtering was performed for 10 minutes, thereby removing the oxide film on the surface.

Next, by using Ti as a target, a Ti layer with a thickness of 0.2 μm was formed by an arc ion plating technique, under the following conditions: an Ar gas pressure of $2\times10^{-1}$ Pa; a bias voltage of −80 V; and a substrate temperature of 280° C.

Next, a TiNx layer with a thickness of 0.1 μm was formed by an arc ion plating technique under the following conditions: $N_2$ gas $15\times10^{-1}$ Pa; a bias voltage of −100 V; and a substrate temperature of 280° C.

Thereafter, the target within the vacuum chamber was replaced with Au, and an Au layer with a thickness of 0.1 μm was formed at an Ar gas pressure of $3\times10^{-1}$ Pa; a bias voltage of −80 V; and a substrate temperature of 200° C.

Example 3

As the Al base, a base (40 mm×50 mm×2 mm) of die-cast aluminum (Si: 10 mass %, Fe: 1 mass %, Cu: 2 mass %, Al: balance) was provided.

In order to clean the surface of the Al base, a blast treatment, degreasing, and acid cleaning were performed, and after drying, the Al base was set in a vacuum chamber.

First, in an Ar gas ambient at 2 to $5\times10^{-1}$ Pa, a cathode sputtering was performed for 20 minutes, thereby removing the oxide film on the surface.

Next, after establishing a vacuum at $1\times10^{-3}$ Pa, the Al base was heated to 320 to 350° C., thus performing degassing for 1 hour.

Thereafter, by using target as a Ti, a Ti layer with a thickness of 0.3 μm was formed by an arc ion plating technique, under the following conditions: an Ar gas pressure of $2\times10^{-1}$ Pa; a bias voltage of −80 V; and a substrate temperature of 280° C.

Next, a TiNx layer with a thickness of 0.1 μm was formed by an arc ion plating technique under the following conditions: $N_2$ gas $15\times10^{-1}$ Pa; a bias voltage of −100 V; and a substrate temperature of 280° C.

Thereafter, the target within the vacuum chamber was replaced with Au, and an Au layer with a thickness of 0.1 μm was formed at an Ar gas pressure of $3\times10^{-1}$ Pa; a bias voltage of −80 V; and a substrate temperature of 200° C.

Example 4

As the Al base, an Al base (40 mm×50 mm×2 mm) of JIS1100 substance (purity: 99% or higher) was provided.

Degreasing for the surface of the Al base was performed (without performing acid cleaning), and after drying, the Al base was set in a vacuum chamber.

First, a cathode sputtering was performed for 1 minute in an Ar gas ambient at $2\times10^{-1}$ Pa. An oxide film having a thickness of about 0.02 μm was present on the surface after sputtering.

Next, by using Ti as a target, a Ti layer with a thickness of 0.5 μm was formed with an arc ion plating technique, under the following conditions: an Ar gas pressure of $2\times10^{-1}$ Pa; a bias voltage of −80 V; and a substrate temperature of 280° C.

Next, a TiNx layer with a thickness of 0.1 μm was formed by an arc ion plating technique under the following conditions: $N_2$ gas $15\times10^{-1}$ Pa; a bias voltage of −100 V; and a substrate temperature of 280° C.

Thereafter, the target within the vacuum chamber was replaced with Au, and an Au layer with a thickness of 0.1 μm was formed at an Ar gas pressure of $3\times10^{-1}$ Pa; a bias voltage of −80 V; and a substrate temperature of 200° C.

Example 5

As the Al base, an Al base (40 mm×50 mm×2 mm) of substance (purity: 99% or higher) was provided.

Degreasing and acid cleaning for the surface of the Al base were performed, and after drying, the Al base was set in a vacuum chamber.

First, in an Ar gas ambient at 2 to $5\times10^{-1}$ Pa, a cathode sputtering was performed for 10 minutes, thereby removing the oxide film on the surface.

Next, by using Ti as a target, a Ti layer with a thickness of 0.3 μm was formed with an arc ion plating technique, under the following conditions: an Ar gas pressure of $2\times10^{-1}$ Pa; a bias voltage of −80 V; and a substrate temperature of 280° C.

Next, a TiNx layer with a thickness of 0.1 μm was formed with an arc ion plating technique under the following conditions: $N_2$ gas $15\times10^{-1}$ Pa; a bias voltage of −100 V; and a substrate temperature of 280° C.

Thereafter, the target within the vacuum chamber was replaced with Au, and an Au layer with a thickness of 0.1 μm was formed at an Ar gas pressure of $3 \times 10^{-1}$ Pa; a bias voltage of −80 V; and a substrate temperature of 200° C.

Example 6

As the Al base, an Al base (40 mm×50 mm×2 mm) of JIS1100 substance (purity: 99% or higher) was provided.

Degreasing and acid cleaning for the surface of the Al base were performed, and after drying, the Al base was set in a vacuum chamber.

First, in an Ar gas ambient at 2 to $5 \times 10^{-1}$ Pa, a cathode sputtering was performed for 10 minutes, thereby removing the oxide film on the surface.

Next, by using Ti as a target, a Ti layer with a thickness of 0.3 μm was formed with an arc ion plating technique, under the following conditions: an Ar gas pressure of $2 \times 10^{-1}$ Pa; a bias voltage of −80 V; and a substrate temperature of 280° C.

Next, a TiNx layer with a thickness of 0.1 μm was formed with an arc ion plating technique under the following conditions: $N_2$ gas $15 \times 10^{-1}$ Pa; a bias voltage of 100 V; and a substrate temperature of 280° C.

Thereafter, the target within the vacuum chamber was replaced with Pt, and a Pt layer with a thickness of 0.3 μm was formed at an Ar gas pressure of $3 \times 10^{-1}$ Pa; a bias voltage of −70 V; and a substrate temperature of 200° C.

Example 7

As the Al base, an Al base (40 mm×50 mm×2 mm) of JIS1100 substance (purity: 99% or higher) was provided.

Degreasing and acid cleaning for the surface of the Al base were performed, and after drying, the Al base was set in a vacuum chamber.

First, in an Ar gas ambient at 2 to $5 \times 10^{-1}$ Pa, a cathode sputtering was performed for 10 minutes, thereby removing the oxide film on the surface.

Next, by using Ti as a target, a Ti layer with a thickness of 0.5 μm was formed with an arc ion plating technique, under the following conditions: an Ar gas pressure of $2 \times 10^{-1}$ Pa; a bias voltage of 80 V; and a substrate temperature of 280° C.

Next, a TiOy layer with a thickness of 0.2 μm was formed with an arc ion plating technique under the following conditions: $O_2$ gas $25 \times 10^{-1}$ Pa; a bias voltage of −100 V; and a substrate temperature of 280° C.

Thereafter, the target within the vacuum chamber was replaced with Au, and an Au layer with a thickness of 0.2 μm was formed at an Ar gas pressure of $3 \times 10^{-1}$ Pa; a bias voltage of −80 V; and a substrate temperature of 200° C.

Example 8

Except that the thickness of the TiNx layer was 0.3 μm, a sample was produced by a similar method to that of Example 2.

Example 9

Except that the thickness of the Ti layer was 0.1 μm, a sample was produced by a similar method to that of Example 1.

Example 10

Except that the thickness of the TiNx layer was 0.06 μm, a sample was produced by a similar method to that of Example 1.

Example 11

Except that the thickness of the Au layer was 0.04 μm, a sample was produced by a similar method to that of Example 5.

Example 12

Except for not performing a one hour heating in a vacuum at 320 to 350° C., a sample was produced by a similar method to that of Example 3.

Example 13

Except that an $N_2$ gas at $5 \times 10^{-1}$ Pa was used when forming a TiN layer by an arc ion plating technique, a sample was produced by a similar method to that of Example 2. In TiNx, x was 0.5. Note that x in the TINx of Examples 1 to 6 and 8 to 12 was 0.9.

Example 14

Except that an $O_2$ gas at $15 \times 10^{-1}$ Pa was used when forming a TiO layer by an arc ion plating technique, a sample was produced by a similar method to that of Example 7. In TiOy, y was 1.0. Note that y in the TiOy of Example 7 was 1.6.

Comparative Example 1

Except for not forming a Ti layer and a TiNx layer, a sample was produced by a similar method to that of Example 1.

Comparative Example 2

Except for not forming a TiNx layer, a sample was produced by a similar method to that of Example 1.

TABLE 1

| | anticorrosiveness test | | |
|---|---|---|---|
| | pH 1 30° C. 1000 Hr | pH 1 30° C. 1500 Hr | pH 2 90° C. 72 Hr |
| Example 1 | no rust occurred | no rust occurred | no rust occurred |
| Example 2 | no rust occurred | spot rust (2 spots) | no rust occurred |
| Example 3 | no rust occurred | no rust occurred | no rust occurred |
| Example 4 | no rust occurred | no rust occurred | no rust occurred |
| Example 5 | no rust occurred | no rust occurred | no rust occurred |
| Example 6 | no rust occurred | no rust occurred | no rust occurred |
| Example 7 | no rust occurred | no rust occurred | no rust occurred |
| Example 8 | no rust occurred | no rust occurred | no rust occurred |
| Example 9 | partial peal of Au, Al rust | partial peal of Au, Al rust | partial peal of Au, Al rust |
| Example 10 | spot rust (20 spots) | spot rust (3 spots) | spot rust (1 spot) |
| Example 11 | spot rust (1 spot) | spot rust Au adhesion failures | spot rust Au adhesion failures |
| Example 12 | spot rust Au adhesion failures | spot rust Au adhesion failures | spot rust Au adhesion failures |
| Example 13 | no rust occurred | spot rust (2 spots) | no rust occurred |
| Example 14 | no rust occurred | spot rust (5 spots) | no rust occurred |
| Comparative Example 1 | peal of Au, Al rust | peal of Au, Al rust | multitude of spot rust |
| Comparative Example 2 | multitude of spot rust (50 spots or more) | multitude of spot rust (50 spots or more) | spot rust (10 spots) |

As can be seen from the result of Comparative Example 1, without providing a Ti layer as an underlying layer and a TiNx layer as an intermediate layer, the adhesion between the Al base and the Au layer as a conductive metal layer is insufficient, so that the Au layer will peel. Moreover, as can be seen from the result of Comparative Example 2, even if a Ti layer is provided, occurrence of rust cannot be suppressed without providing a TiNx layer as an intermediate layer. This is considered because a TiNx layer excels in adhesion with an Au layer, and is also dense.

Examples 1 to 14 each has a superior anticorrosiveness to those of Comparative Examples 1 and 2. Note that, as can be seen from the results of Examples 1 and 2 and Example 9, it is preferable that the thickness of the Ti layer is 0.2 μm or more. Moreover, as can be seen from a comparison between Example 2 and Example 8, by ensuring that the TiNx layer has a thickness of 0.3 μm or more and that the total thickness of the Ti layer and the TiNx layer is 0.5 μm or more, anticorrosiveness is further improved. This effect is outstanding when the thickness of the Au layer is 0.1 μm or less.

Moreover, as can be seen from a comparison between Example 1 and Example 4, a sufficient adhesion with a Ti layer can be obtained even if an oxide film is remaining on the surface of the Al base.

Moreover, as can be seen from a comparison between Example 1 and Example 10, it is preferable that the TiNx layer has a thickness of 0.1 μm or more.

Moreover, as can be seen from a comparison between Example 5 and Example 11, it is preferable that the Au layer has a thickness of 0.05 μm or more.

Moreover, as can be seen from a comparison between Example 3 and Example 12, in the case of using a die-cast aluminum as the Al base, it is preferable to perform a vacuum heating before forming the Ti layer, and perform the subsequent steps at a temperature which is equal to or less than that of the vacuum heating. The temperature of the vacuum heating is preferably between 300° C. and 350° C. If it is less than 300° C., a sufficient impurity removing effect may not be obtained; and if it exceeds 350° C., deformation may occur in the Al base.

Moreover, as can be seen from Example 6, not only an Au layer but also a Pt layer can be used as the conductive metal layer.

Furthermore, as can be seen from Example 7 and Example 14, not only a TiNx layer but also a TiOy layer can be used as the intermediate layer.

Note that, the TiNx layer formed in Examples 1 to 6 and 8 to 12 had a composition of $TiN_{0.9}$. As a result of conducting various studies, it is preferable that x in TiNx is 1.0 or less. When x exceeds 1.0, a problem occurs in that the strain of the film is increased. Moreover, from the standpoint of anticorrosiveness, it is preferable that x is 0.5 or more, as can be seen from the result of Example 13. Moreover, anticorrosiveness can be further improved by ensuring that x is between 0.7 and 1.0.

Moreover, the TiOy layer formed in Example 7 had a composition of $TiO_{1.6}$. As a result of conducting various studies, it is preferable that y in TiOy is 2.0 or less. From the standpoint of anticorrosiveness, it is preferable that y is 1.0 or more, as can be seen from the result of Example 14. Moreover, anticorrosiveness can be further improved by ensuring that y is between 1.2 and 2.0. Moreover, it was confirmed that the TiOy layer formed in Examples 7 and 14 did not contain TiOH.

INDUSTRIAL APPLICABILITY

A separator for a fuel cell according to the present invention has excellent anticorrosiveness and electrical conductivity, and therefore can be widely used for power sources for automobiles, power sources for mobile devices, decentralized power sources, and the like. In particular, it can be suitably used for a fuel cell in which a multitude of cells are stacked.

The invention claimed is:
1. A separator for a fuel cell comprising:
   a base containing 70 mass % or more of Al;
   an underlying layer being formed directly on the base and containing Ti;
   an intermediate layer being formed directly on the underlying layer and containing TiNx or TiOy; and
   a conductive metal layer being formed directly on the intermediate layer and containing Au or Pt,
   wherein x in TiNx is 0.5 or more and less than 1.0, and
   wherein y in TiOy is 1.0 or more and 2.0 or less.
2. The separator for a fuel cell of claim 1, wherein the underlying layer has a thickness of 0.2 μm or more.
3. The separator for a fuel cell of claim 1, wherein the intermediate layer has a thickness between 0.1 μm and 2.0 μm.
4. The separator for a fuel cell of claim 1, wherein the conductive metal layer has a thickness of 0.05 μm or more.
5. The separator for a fuel cell of claim 1, wherein the conductive metal layer has a thickness of 0.10 μm or less, and a total thickness of the underlying layer and the intermediate layer is 0.5 μm or more.
6. The separator for a fuel cell of claim 5, wherein the conductive metal layer has a thickness of 0.10 μm or less, and the intermediate layer has a thickness of 0.3 μm or more.
7. A method of producing a separator for a fuel cell, comprising the steps of:
   (a) providing a base containing 70 wt % or more of Al;
   (b) cleaning a surface of the base;
   (c) forming an underlying layer containing Ti directly on the cleaned surface of the base by a vapor deposition technique;
   (d) forming an intermediate layer containing TiNx or TiOy directly on the underlying layer by a vapor deposition technique; and
   (e) forming a conductive metal layer containing Au or Pt directly on the intermediate layer,
   wherein x in TiNx is 0.5 or more and less than 1.0, and
   wherein y in TiOy is 1.0 or more and 2.0 or less.
8. The method of producing a separator for a fuel cell of claim 7, wherein the vapor deposition techniques in steps (c) and (d) are a sputtering technique or an ion plating technique.
9. The method of producing a separator for a fuel cell of claim 7, further comprising, after step (b) and before step (c), a step of at least partially removing an oxide film that is on the surface of the base.
10. The method of producing a separator for a fuel cell of claim 7, wherein,
   step (a) is a step of providing a base made of a die-cast aluminum alloy;
   the method further comprises, before step (c), a step of performing a vacuum heating at a temperature between 300° C. and 350° C.; and
   steps (c) and (d) are performed at a temperature which is equal to or less than that of the vacuum heating.
11. The separator for a fuel cell of claim 1, wherein the base includes Al oxide layer having a thickness less than 10 μm.

* * * * *